(12) United States Patent
Udrea et al.

(10) Patent No.: US 10,818,786 B1
(45) Date of Patent: Oct. 27, 2020

(54) III-V SEMICONDUCTOR DEVICE WITH INTEGRATED PROTECTION FUNCTIONS

(71) Applicant: Cambridge GaN Devices Limited, Cambourne (GB)

(72) Inventors: Florin Udrea, Cambridge (GB); Loizos Efthymiou, Cambridge (GB); Giorgia Longobardi, Cambridge (GB); Martin Arnold, Cambridge (GB)

(73) Assignee: CAMBRIDGE GAN DEVICES LIMITED, Cambourn (GB)

( * ) Notice: Subject to any disclaimer, the term of this patent is extended or adjusted under 35 U.S.C. 154(b) by 0 days.

(21) Appl. No.: 16/405,671

(22) Filed: May 7, 2019

(51) Int. Cl.
*H01L 21/02* (2006.01)
*H01L 27/02* (2006.01)
(Continued)

(52) U.S. Cl.
CPC ...... *H01L 29/7786* (2013.01); *H01L 21/0254* (2013.01); *H01L 27/0248* (2013.01);
(Continued)

(58) Field of Classification Search
CPC ............. H01L 29/7786; H01L 29/2003; H01L 29/205; H01L 29/66462; H01L 21/0254; H01L 27/0248; H01L 27/095
(Continued)

(56) References Cited

U.S. PATENT DOCUMENTS

| 2011/0193171 | A1* | 8/2011 | Yamagiwa | .......... | H01L 27/0605 257/355 |
| 2011/0309372 | A1 | 12/2011 | Xin et al. | | |

(Continued)

FOREIGN PATENT DOCUMENTS

WO   2019012293 A1   1/2019

OTHER PUBLICATIONS

Injun Hwang et al., "1.6kV, 2.9 mΩ cm2 Normally-off p-GaN HEMT Device", Proceedings of the 2012 24th International Symposium on Power Semiconductor Devices and ICs Jun. 3-7, 2012—Bruges, Belgium, 4 pages.
(Continued)

*Primary Examiner* — Tong-Ho Kim
(74) *Attorney, Agent, or Firm* — Tucker Ellis LLP

(57) ABSTRACT

We disclose a III-nitride semiconductor based heterojunction power device, comprising: a first heterojunction transistor formed on a substrate, the first heterojunction transistor comprising: a first III-nitride semiconductor region formed over the substrate, wherein the first III-nitride semiconductor region comprises a first heterojunction comprising at least one two dimensional carrier gas of second conductivity type; a first terminal operatively connected to the first III-nitride semiconductor region; a second terminal laterally spaced from the first terminal and operatively connected to the first III-nitride semiconductor region; a first gate terminal formed over the first III-nitride semiconductor region between the first terminal and the second terminal. The device also includes a second heterojunction transistor formed on a substrate, the second heterojunction transistor comprising: a second III-nitride semiconductor region formed over the substrate, wherein the second III-nitride semiconductor region comprises a second heterojunction comprising at least one two dimensional carrier gas of second conductivity type; a third terminal operatively connected to the second III-nitride semiconductor region; a fourth terminal laterally spaced from the third terminal in a first dimension and operatively connected to the second III-nitride semiconductor region, wherein the fourth terminal is operatively connected to the first gate terminal; and a second gate terminal formed over the second III-nitride semiconductor region between the third terminal and the fourth terminal and wherein the second heterojunction tran-
(Continued)

sistor is used in sensing and protection functions of the first power heterojunction transistor.

19 Claims, 7 Drawing Sheets

(51) Int. Cl.
  *H01L 27/095*    (2006.01)
  *H01L 29/20*    (2006.01)
  *H01L 29/205*    (2006.01)
  *H01L 29/66*    (2006.01)
  *H01L 29/778*    (2006.01)

(52) U.S. Cl.
  CPC ........ *H01L 27/095* (2013.01); *H01L 29/2003* (2013.01); *H01L 29/205* (2013.01); *H01L 29/66462* (2013.01)

(58) Field of Classification Search
  USPC .......................................................... 257/194
  See application file for complete search history.

(56) References Cited

U.S. PATENT DOCUMENTS

| | | |
|---|---|---|
| 2016/0056150 A1 | 2/2016 | Nagai et al. |
| 2016/0307886 A1* | 10/2016 | Roberts ............... H01L 27/0248 |
| 2016/0313378 A1 | 10/2016 | Duvjnak et al. |
| 2017/0179834 A1 | 6/2017 | Lin |

OTHER PUBLICATIONS

Man Ho Kwan et al., "CMOS-Compatible GaN-on-Si Field-Effect Transistors for High Voltage Power Applications", pp. 17.6.1-17.6.4, 2014, 4 pages.

Silvia Lenci et al., "Au-Free AlGaN/GaN Power Diode on 8-in Si Substrate With Gated Edge Termination", IEEE Electron Device Letters, vol. 34, No. 8, August 2013, 3 pages.

Umesh K Mishra et al., "GaN-Based RF Power Devices and Amplifiers, Proceedings of the IEEE", vol. 96, No. 2, Feb. 2008, pp. 287-305, 19 pages.

Tohru Oka et al., "AlGaN/GaN Recessed MIS-Gate HFET With High-Threshold-Voltage Normally-Off Operation for Power Electronics Applications", IEEE Electron Device Letters, vol. 29, No. 7, Jul. 2008, pp. 668-669, 3 pages.

Yasuhiro Uemoto et al., "Gate Injection Transistor (GIT)—A Normally-Off AlGaN/GaN Power Transistor Using Conductivity Modulation", IEEE Transactions on Electron Devices, vol. 54, No. 12, Dec. 2007, pp. 3393-3399, 7 pages.

Michael J. Uren et al., "Buffer Design to Minimize Current Collapse in GaN/AlGaN HFETs", IEEE Transactions on Electron Devices, vol. 59, No. 12, Dec. 2012, pp. 3327-3333, 7 pages.

Wataru Saito et al., "Recessed-Gate Structure Approach Toward Normally Off High-Voltage AlGaN/GaN HEMT for Power Electronics Applications", IEEE Transactions on Electron Devices, vol. 53, No. 2, Feb. 2006, pp. 356-362, 7 pages.

Yong Cai et al., "High-Performance Enhancement-Mode AlGaN/GaN HEMTs Using Fluoride-Based Plasma Treatment", IEEE Electron Device Letters, vol. 26, No. 7, Jul. 2005, pp. 435-437, 3 pages.

Andrea Natale Tallarico et al., "PBTI in GaN-HEMTs With p-Type Gate: Role of the Aluminum Content on VTH and Underlying Degradation Mechanisms", EEE Transactions on Electron Devices, vol. 65, No. 1, Jan. 2018, pp. 38-44, 7 pages.

Partial International Search Report for corresponding International Patent Application No. PCT/EP20201062699, dated Jun. 16, 2020, 19 pages.

Roberts John et al.: "Drive and protection methods for very high current lateral GaN power transistors", 2015 IEEE Applied Power Electronics Conference and Exposition (APEC), IEEE; dated Mar. 15, 2015, pp. 3128-3131.

\* cited by examiner

STATE OF THE ART

STATE OF THE ART

III-V SEMICONDUCTOR DEVICE WITH INTEGRATED PROTECTION FUNCTIONS

FILED OF THE DISCLOSURE

The disclosure relates to power semiconductor devices. Particularly, but not exclusively, the disclosure relates to the use of a hetero-structure AlGaN/GaN high electron mobility transistor or rectifier.

BACKGROUND OF THE DISCLOSURE

A power semiconductor device is a semiconductor device used as a switch or rectifier in power electronics. A power semiconductor device is usually used in "commutation mode" (i.e., it is either on or off), and therefore has a design optimized for such usage.

Silicon bipolar junction transistors (BJT), Metal-Oxide-Semiconductor field effect transistors (MOSFET) and insulated gate bipolar transistors (IGBT) are common types of power semiconductor switching devices. Their application areas range from switch mode power supplies for consumer electronics, electric cars, motor control and power supplies to RF and microwave circuits and telecommunication systems.

Gallium Nitride (GaN) is a wide band gap material with properties that make it a suitable candidate for use in several fields of application (e.g. radio-frequency electronics, optoelectronics, and power electronics) which require solid-state devices.

GaN technology allows transistors with high electron mobility and high saturation velocity to be designed. These properties of GaN have made it a good candidate for high-power and high-temperature microwave applications, for example radar and cellular communications systems. As systems expand in subscribers and desired capacity, interest in increasing their operating frequency and power has grown correspondingly. Higher frequency signals can carry more information (bandwidth) and allow for smaller antennas with very high gain.

Additionally, GaN with its wide bandgap offers the potential for emitting light at higher frequencies for example the green, blue, violet, and ultraviolet portions of the electromagnetic spectrum.

In the last decade, Gallium Nitride (GaN) has increasingly been considered as a very promising material for use in the field of power devices. The application areas range from portable consumer electronics, solar power inverters, electric vehicles and power supplies. The wide band gap of the material ($E_g$=3.39 eV) results in high critical electric field ($E_c$=3.3 MV/cm) which can lead to the design of devices with a shorter drift region, and therefore lower on-state resistance, if compared to a silicon-based device with the same breakdown voltage.

The use of an Aluminium Galium Nitride (AlGaN)/GaN heterostructure also allows the formation of a two-dimensional electron gas (2DEG) at the hetero-interface where carriers can reach very high mobility ($\mu$=2000 cm$^2$/(Vs)) values. In addition, the piezopolarization charge present at the AlGaN/GaN heterostructure, results in a high electron density in the 2DEG layer (e.g. $1e^{13}$ cm$^{-2}$). These properties allow the development of High Electron Mobility Transistors (HEMTs) and Schottky barrier diodes with very competitive performance parameters. An extensive amount of research has focused on the development of power devices using AlGaN/GaN heterostructures.

However, the 2DEG which inherently exists at the AlGaN/GaN hetero-interface creates a challenge when attempting the design of enhancement mode rather than depletion mode devices. Nonetheless, several methods have been proposed which can lead to enhancement mode devices, among them the use of metal insulator semiconductor structures, use of fluorine treatment, recessed gate structures and use of a p-type cap layer. Due to the relative maturity and controllability in the epitaxial growth of pGaN layers compared to the other techniques, pGaN/AlGaN/GaN HEMTs are currently the leading structure for commercialization.

FIG. 1 shows a cross section of the active area of a state of the art pGaN HEMT. The device includes an AlGaN layer 1, a GaN layer 2, a transition layer 3, a silicon substrate 4, a substrate terminal 5, a SiO$_2$ passivation 6, a source terminal 8, a drain terminal 9, a gate terminal 10, and a highly p-doped GaN 11. The device shown is a lateral three-terminal device with an AlGaN/GaN heterostructure grown epitaxially on a standard silicon wafer. The transition layer is used to allow a high quality GaN layer to be grown despite the significant lattice mismatch between GaN and Si. Carbon p-type doping is often added in the GaN layer. Finally, a thin cap GaN layer is typically added to form the gate with a Magnesium (Mg) p-type doping density greater than 1×10$^{19}$ cm$^{-3}$. A typical pGaN gate device has a threshold voltage of ~1.5-2V and gate turn-on bias voltage of ~8V.

While an enhancement mode device is used in a lot of power electronic applications as the main power switch, there are other applications where a depletion mode device can be more suitable. In general, a depletion mode AlGaN/GaN transistor is made by placing a Schottky metal contact 12, which acts as the gate terminal, directly on the AlGaN layer (excluding the p-GaN cap layer which exists in the enhancement mode devices) as seen in FIG. 2.

In state of the art devices, there is a trend to integrate more functions and more devices, such as transistors, into a single chip to fabricate smaller, smarter, and more powerful systems. The combination and integration of enhancement and depletion mode transistors is a key enabler for advanced logic, analog and digital circuits.

In power electronics there is often a need for protection and sensing circuitry (e.g. current sensing, over-voltage protection, temperature sensing) to be integrated monolithically with the main, often enhancement mode, power switch. Monolithic integration of such functionality rather than a discrete implementation would allow a reduction in the overall system size/costs, a reduction in the bill of material and would lead to improved performance through the reduction of parasitic components associated with the interconnections between discrete devices. In such sensing and protection circuitry, there is often the need of using a depletion mode or normally-on device.

The state of the art does not offer the ability to form the gate terminal of both an enhancement mode and depletion mode device within the same fabrication step. In state of the art devices the Schottky contact is formed in a separate fabrication step.

In state of the art depletion mode Schottky gate devices, the threshold voltage of the device (i.e. the gate bias voltage at which the device is considered to move from the off-state to the on-state and vice versa) is dependent on process parameters such as, but not limited to, the AlGaN layer thickness, aluminium mole fraction and gate metal stack. Therefore, to adjust the threshold voltage to a level which is most suitable for a specific application would require a change in the epitaxial growth and/or the gate metal processing, which is time consuming and not cost efficient. The ability to reliably adjust the device threshold voltage through layout modifications would be significantly less time consuming and more cost efficient in comparison. Such capability does not currently exist in the state of the art.

State of the art depletion mode devices in the on-state have a limit on the maximum positive gate bias voltage which can be applied on the gate terminal before the main on-state conduction path (i.e. low resistance path) changes from drain-source to gate-source. This maximum bias voltage depends on the Schottky barrier height present at the gate contact and does not exceed 2V. A depletion mode HEMT device which can be biased beyond this voltage level does not exist in the state of the art.

SUMMARY

The present disclosure relates to semiconductor structures and devices formed in Group III nitrides and more specifically GaN and $Al_xGa N_{1-x}$ structures.

According to this disclosure, there is provided protection and sensing circuitry using at least one depletion mode device that may be integrated monolithically with the main, often enhancement mode, power switch. The ability to sense the current through the main power HEMT and using that to adjust the gate bias of the main power HEMT can be used to avoid drain over-current events on the load side or offer longer endurance time during a short-circuit condition. Monolithic integration of such functionality rather than a discrete implementation allows a reduction in the overall system size/costs, a reduction in the bill of material and can lead to improved performance through the reduction of parasitic components associated with the interconnections between discrete devices.

There is further provided a protection circuit which can limit over-voltage events on the p-gate of the power HEMT. Studies have shown that over-voltage events on the p-gate of the power HEMT can lead to safety concerns, limiting the safe operating area (SOA) of the device. The avoidance of over-voltage events is an even more challenging task in p-gate GaN devices due to the narrow window of acceptable gate voltage bias compared to Si MOS technology.

According to this disclosure, there is provided a semiconductor device in GaN technology with an integrated sensing and protection circuit where the main power transistor and transistors used for sensing may be made using the same gate technology. The drain terminal of at least one of the transistors used in the sensing and protection circuit may be connected to the gate terminal of the main power transistor. Different implementations of other sensing and protection circuits are included to mitigate over-current and over gate voltage events.

The depletion mode transistor, according to this invention, may contain a gate structure based on a discontinuous p-GaN layer containing islands within stripes or closed shapes around the cells that act to modulate the conductive path between the high voltage terminal and low voltage terminal, when a gate voltage is provided and may be used in the protection circuits. All such islands may be connected to the same gate electrode. By discontinuous islands we mean that between adjacent islands there is no p-GaN layer present, and as such, there is a direct, unobstructed conductive path between the source and the drain terminals, through the 2DEG layer formed at the heterojunction between GaN and AlGaN, in between the islands. However, adjacent islands may be placed close together across (orthogonal to) the current path such that the potential applied to the p-GaN gate islands modulates the conductive region between the islands (the 2DEG layer) and thus modulate the direct path between the source and the drain. The p-GaN layers in the continuous and discontinuous gate structures may be manufactured in the same process step and the difference between continuous and discontinuous is realized by a layout change of the same mask.

According to one aspect of this invention, there is provided a sensing and protection circuit which uses at least one depletion mode transistor as described above. The depletion mode transistor senses a specific own gate voltage or/and drain current and acts to lower or limit the gate voltage on the main power transistor when a condition of over gate voltage or over drain current is detected in the main power transistor. The specific on-state gate voltage is equal to the voltage at which a two dimensional electron gas (2DEG) is formed under the p-GaN islands and results in a steep increase in current (i.e. decrease in the on-state resistance) of the normally on sensing device.

According to a first aspect of the disclosure there is provided a III-nitride semiconductor based heterojunction power device, comprising:
  a first power heterojunction transistor (or main power transistor) formed on a substrate, the first heterojunction transistor comprising:
    a first III-nitride semiconductor region formed over the substrate, wherein the first III-nitride semiconductor region comprises a first heterojunction comprising at least one two dimensional carrier gas of the second conductivity type;
    a first terminal (or source) operatively connected to the first III-nitride semiconductor region;
    a second terminal (or drain) laterally spaced from the first terminal and operatively connected to the first III-nitride semiconductor region;
    a first gate region, formed over the first III-nitride semiconductor region between the first terminal and the second terminal;
    a first gate terminal contacting the first gate region,
  at least one second heterojunction transistor (or sensing transistor) formed on a substrate, the second heterojunction transistor comprising:
    a second III-nitride semiconductor region formed over the substrate, wherein the second III-nitride semiconductor region comprises a second heterojunction comprising at least one two dimensional carrier gas of the second conductivity type;
    a third terminal (or source) operatively connected to the second III-nitride semiconductor region;
    a fourth terminal (or drain) laterally spaced from the third terminal in a first dimension and operatively connected to the second III-nitride semiconductor region, wherein the fourth terminal is connected to the first gate terminal
    a second gate region, formed over the second III-nitride semiconductor region between the third terminal and the fourth terminal;
    a second gate terminal contacting the second gate region,
    wherein the second heterojunction transistor is used in sensing and protection functions of the first power heterojunction transistor.

The second heterojunction transistor may be a normally-on transistor based on a discontinuous p-GaN layer containing islands within stripes or closed shapes around the cells that act to modulate the conductive path between the high voltage terminal and low voltage terminal, when a gate voltage is provided.

According to a second aspect of the invention the sensing and protection functions may refer to the sensing of the current through the first terminal of the first power heterojunction transistor and the limiting of the gate voltage of the power heterojunction transistor.

According to a third aspect of the invention the sensing and protection functions may refer to sensing the first gate terminal voltage of the power heterojunction transistor and limiting the voltage applied to the first gate terminal of the power heterojunction transistor.

According to a fourth aspect of the invention the sensing and protection functions may refer to both sensing of the current through the first terminal of the first power heterojunction transistor and sensing the first gate terminal voltage of the power heterojunction transistor and as a result of either of the sensing functions, limiting the voltage applied to the first gate of the power heterojunction transistor.

It is an object of the disclosure to provide a semiconductor device preferably using GaN technology, with an integrated sensing and protection circuit where the main power transistor which preferably uses a gate structure based on a continuous p-GaN layer, and transistors used for sensing are made using the same gate technology preferably featuring continuous or discontinuous p-GaN layers. According to this invention, the drain terminal of at least one of the sensing transistors is connected to the gate terminal of the main power transistor. Different implementations of protection circuits are described to mitigate gate over-voltage and drain over-current events. This helps with a rugged operation and increased safe operating area.

The second heterojunction transistor may be formed on the same substrate and using virtually all the same GaN based layers as the first heterojunction power transistor, but placed in a different area of the integrated chip. The first heterojunction transistor could be in this case monolithically integrated with the second heterojunction transistor. The monolithic integration of the components described above allows a reduction in the overall system size and costs. It also leads to improved performance through the reduction of parasitic components associated with the interconnections between discrete devices.

Preferably, the starting substrate may be silicon. However, any other substrate combining silicon with another semiconducting material compatible with state-of-the-art fabrication processes may be used. Employment of a silicon substrate facilitates etching techniques, low cost, high reproducibility, and wide availability of foundries supporting the process. Alternative substrate materials may include sapphire, silicon carbide (SiC), gallium nitride (GaN), and gallium arsenide (GaAs). Other alternatives may also be possible. Also, this disclosure covers the possibility of growing the III-nitride semiconductor region comprising the heterojunction (or heterostructure) on a first substrate suitable for the purpose and then transferring the heterostructure on a second substrate. The second substrate might be any of the previously mentioned substrates or a different one (e.g. a polydimethylsiloxane, PDMS, flexible substrate, diamond). Silicon as substrate material will be used for illustrative purposes in the embodiments hereafter and in the accompanying drawings.

The first heterojunction transistor may further comprise a first one or plurality of highly doped semiconductor regions of a first conductivity type formed over the first III-nitride semiconductor region, and the first gate terminal may be formed over the first one or plurality of highly doped semiconductor regions. The second heterojunction transistor may comprise a second one or plurality of highly doped semiconductor regions of the first conductivity formed over the second III-nitride semiconductor region, and the second gate terminal may be formed over the second one or plurality of highly doped semiconductor regions. It will be understood that both first and second highly doped regions can be one continuous region or a plurality of discrete regions. The disclosure covers both scenarios.

The first gate terminal may be formed over the first plurality of highly doped semiconductor regions. The second gate terminal may be formed over the second plurality of highly doped semiconductor regions. The first gate terminal and/or the second gate terminal may comprise an Ohmic contact. Alternatively, the first gate terminal and/or the second gate terminal may comprise a Schottky contact.

The first heterojunction of the first III-nitride semiconductor region may comprise: a first III-nitride semiconductor layer having a first band gap formed over the substrate; a second III-nitride semiconductor layer having a second bandgap different from the first band gap disposed on the first III-nitride semiconductor layer; and at least one two-dimensional carrier gas of the second conductivity type formed at the interface between the first and second III-nitride semiconductor layers to provide a channel. The second heterojunction of the second III-nitride semiconductor region may comprise: a third III-nitride semiconductor layer having a first band gap formed over the substrate; a fourth III-nitride semiconductor layer having a second bandgap different from the first band gap disposed on the first III-nitride semiconductor layer; and at least one two-dimensional carrier gas of the second conductivity type formed at the interface between the third and fourth III-nitride semiconductor layers to provide a channel.

Each of the first III-nitride semiconductor layer, second III-nitride semiconductor layer, third III-nitride semiconductor layer, and fourth III-nitride semiconductor layer may comprise any one of gallium nitride (GaN), aluminium gallium nitride (AlGaN) and indium aluminium gallium nitride (InAlGaN).

The heterostructures may comprise elemental semiconductors (e.g. Si, Ge), binary compounds from Group III and Group IV (e.g. GaAs), or Group II and Group VI (e.g. ZnS), or Group III and Group V (e.g. GaN), binary alloy semiconductors (e.g. SiGe), ternary alloys (e.g. AlGaAs), quaternary alloys (e.g. InGaAsP) or even pentary materials (e.g. GaInPSbAs). Some examples of possible heterostructures thus follow: AlGaAs/GaAs, InGaP/GaAs, InP/InGaAs, InAlAs/InGaAs, SiGe/Si, AlGaAs/InGaAs, InAlAs/InGaAs and InAlN/GaN, AlGaN/GaN. Preferably the heterostructures will be an AlGaN/GaN heterostructures comprising a two dimensional electron gas (2DEG); this will be used for illustrative purposes in the embodiments hereafter and in the accompanying drawings. GaN and AlGaN technology allows transistors with high electron mobility and high saturation velocity to be designed.

The at least one two dimensional carrier gas may be a two dimensional electron gas (2DEG) or a two dimensional hole gas (2DHG), the former being preferable because of the very high electron mobility.

The first plurality of highly doped semiconductor regions may comprise a single continuous highly doped region of p-type conductivity corresponding to a device featuring a 2DEG or n-type conductivity corresponding to a device featuring 2DHG. Alternatively, the first plurality of highly doped regions may comprise at least two discrete highly doped semiconductor regions of p-type conductivity corresponding to a device featuring a 2DEG or n-type conductivity corresponding to a device featuring 2DHG.

The second plurality of highly doped semiconductor regions may comprise a single continuous highly doped region. Alternatively, the second plurality of highly doped semiconductor regions may comprise at least two highly doped semiconductor regions laterally spaced from each other in a second dimension.

The highly doped semiconductor regions (islands) may be placed on the semiconductor surface of the heterojunction and at zero gate-source terminal bias they create a depletion of the conductive channel (2D carrier gas) directly under it. An uninterrupted channel is present at zero gate-source bias between the third (source) and fourth (drain) terminals along the paths where the highly doped layer is not present (on the 2D carrier gas formed under the region between the islands). This uninterrupted channel is present as long as the gate-source bias is greater than the first threshold voltage.

With a more negative bias applied to the gate terminal with respect to the source terminal, the carrier concentration in the conductive channel (region) between the drain and source terminals is reduced due to electric field extending from the highly doped islands to the region between the islands. This lateral field depletes the 2D carrier gas formed under the region between highly doped semiconductor islands and thus obstructs the current path through the 2D carrier gas resistance between the source (third terminal) and the drain (fourth terminal). The critical gate bias value at which the device is considered to move from the on-state (low resistance) to the off-state is defined as the first threshold voltage or the device threshold voltage. Note that instead of applying a negative potential to the gate with respect to the source terminal, it is also possible to keep the gate grounded and applying a positive potential to the source with the same result.

Each of the highly doped semiconductor regions may be spaced from the nearest other highly doped semiconductor region. The threshold voltage may be controlled by the separation between adjacent highly doped islands, layer thicknesses, and doping fractions. The specific on-state resistance of the depletion mode transistor may be controlled by the number of separations between highly doped islands and the width (in the second dimension) of the highly doped islands with respect to the separation (i.e. pitch) between the islands.

The at least two highly doped semiconductor regions may comprise discrete regions, wherein each of the at least two highly doped semiconductor discrete regions may be separated from the nearest other highly doped semiconductor regions by a predetermined distance (i.e. pitch). The discrete regions (or discontinuous islands) may be formed such that between adjacent islands there is no highly doped semiconductor layer present, and as such, there is a direct, unobstructed conductive path between the third terminal (source) and the fourth terminal (drain) provided by an undepleted 2D carrier gas layer. Adjacent islands may be placed close together in a line across (and orthogonal to) the current path, such that the potential applied to the gate modulates the conductive region (i.e. the portion of the 2D carrier gas layer) between the islands and thus modulates the direct path between the source and the drain.

The at least two highly doped semiconductor regions may be aligned in the first dimension. In other words, the at least two highly doped semiconductor regions may form a line of highly doped semiconductor regions extending in the second dimension, in a different direction to the current flow between the first terminal and the second terminal.

The second heterojunction transistor may be configured as a depletion mode field effect transistor. In other words, the second heterojunction transistor may be configured as a normally-on transistor as described above.

The depletion mode transistor may have two threshold voltages. The first threshold voltage may be negative and may be equivalent to that of a classical normally-on transistor, indicating the transition from the off-state to the on-state. Preferably, the second threshold voltage may be positive and may be characterised by a steep current increase. The second threshold voltage can occur at the same value as that of the integrated normally-off device featuring a continuous highly doped semiconductor gate.

When the gate voltage of the depletion mode transistor is very negative, the adjacent highly doped semiconductor gate islands deplete the portion of the 2D carrier gas between them, obstructing the path for electrons or holes to flow from the source to drain. Once the gate-source voltage is equal or greater than the first threshold voltage, the 2D carrier gas starts forming at the middle of the pitch between adjacent p-islands. At this stage a conductive path is established between the source and drain. The value of the first threshold voltage can be adjusted by controlling the pitch between adjacent highly doped semiconductor islands. As the gate-source voltage is increased above the first threshold voltage but remaining below the second threshold voltage, the formation of the 2D carrier gas channel spreads from the middle of the pitch between adjacent highly doped semiconductor islands towards the edges of the highly doped semiconductor gate islands. The current continues to increase as the on-state resistance is reduced. When the second threshold voltage (which is preferably positive) is reached, a steep increase in the current is seen as the 2D carrier gas spreads under the p-gate islands allowing the current to flow through this region, thus resulting in an increase conduction area. This is characterised by a steep increase in current and, as a result, a steep decrease in the on-state resistance. The rate of the current increase depends on the ratio between the width of the highly doped semiconductor gate islands and the pitch between them.

The depletion mode transistor which may contain a gate structure based on discontinuous p-GaN layer of islands within stripes or closed shapes around the cells senses a specific own gate voltage or/and drain current and acts to lower or limit the gate voltage on the main power transistor when a condition of over gate voltage or over drain current is detected in the main power transistor. The specific on-state gate voltage is equal to the voltage at which a two dimensional electron gas (2DEG) is formed under the p-GaN islands and results in a steep decrease in the on-state resistance of the normally on, depletion mode transistor.

The at least two highly doped semiconductor regions may comprise a p-type gallium nitride (p-GaN) material. The pGaN forms a barrier with the AlGaN material underneath. The high doping of the pGaN facilitates a depletion region to penetrate the AlGaN layer to reach the 2DEG, function of the potential applied to the gate terminal with respect to the source terminal. Hole tunnelling occurs from the gate terminal into the semiconductor when the potential on the gate is increased. A certain amount of hole current through the gate has a positive effect on the stability of the device during dynamic high voltage stress, but if the gate current is too high this is seen as leakage in the control terminal affecting the driver and the total losses of the device. It is apparent that the use of a pGaN gate is what creates the depletion of the 2DEG underneath it at zero gate bias and thus allows the design of a normally-off (enhancement mode) device. (an n-doped region would not act in the same way).

The device may further comprise a transition layer formed between the substrate and the first III-nitride semiconductor region or the second III-nitride semiconductor region. The transition layer may be present between the heterostructure and the bulk substrate to minimise the lattice mismatch or accommodate the mechanical stress in the heterostructure. The transition layer may comprise a nucleation layer. The nucleation layer may be made of Aluminium Nitride (AlN) or any other suitable material, and may be placed on the substrate. The nucleation layer may form the first sub-layer of a transition layer made of different sub-layers containing the same materials as the first and second semiconductor layers of the heterostructure device (for example AlGaN or GaN materials). This helps to release the mechanical stress and accommodate the lattice mismatch between the substrate (for example silicon) and the heterostructure formed on top.

In embodiments of the disclosure where the substrate is silicon and the heterostructure is based on III-Nitride compounds such as GaN, the transition layer may comprise a single layer of $Al_xGaN_{1-x}N$ (x being the aluminium mole fraction of the compound) or any composition of $Al_xGaN_{1-x}N/Al_yGaN_{1-y}N$ (y being the aluminium mole fraction of the compound) creating a multilayer stack, also known as superlattice.

The heterojunction power device may further comprise an isolation layer formed between the first heterojunction transistor and the second heterojunction transistor.

The second heterojunction transistor may form part of a sensing and protection circuit for the first heterojunction transistor. The second heterojunction transistor may be integrated with the first heterojunction transistor whereas the rest of the sensing and protection circuit may not be monolithically integrated with the first heterojunction transistor, but provided within the same package or a separate package. Alternatively, the entire sensing and protection circuit may be monolithically integrated with the first heterojunction transistor.

According to a second aspect of the invention the sensing and protection functions described in the first aspect of the invention refer to the sensing of the current flowing through the first terminal of the first power heterojunction transistor and limiting of the gate voltage of the first power heterojunction transistor.

The sensing of the current in the main power transistor can be done by using a resistor attached to the first terminal (source) and monitoring the voltage developed across this resistor. This however leads to an increased potential in the source of the power device resulting in both lower effective gate to source voltage applied to the main transistor and additional losses through the power dissipated in the resistor.

Instead it is better to use a current sensing device monolithically integrated with the power switch.

According to a second aspect of this invention, the first power heterojunction transistor may comprise two transistors wherein the gates of the two transistors may be electrically connected. The two transistors, termed (i) the main power transistor and (ii) the current sensing transistor forming the first power heterojunction transistor may be identical in terms of structure but the main power transistor having a much larger active area than the current sensing transistor (e.g. by a factor of 10×, 100×, 1000×). The two transistors may have the drains connected together and the gates connected together but separate source terminals. The current sensing transistor may be used to sense the current flowing through the source of the main power transistor.

The second gate terminal of the second heterojunction transistor described in the first aspect of this invention may be operatively connected to the source terminal of the current sensing transistor. In other words, the source of the current sensing transistor, and the gate of the second heterojunction transistor may be connected. As described in the first aspect of this invention, the gate of the first power transistor is connected to the drain of the second heterojunction transistor.

The device may further comprise a first resistor (current sensing resistor). The second gate terminal (the gate of the second transistor) may be operatively connected to the source of the current sensing transistor and the first terminal of the resistor. The second terminal of the first resistor may be operatively connected to the source terminal of main power transistor. Alternatively, the second terminal of the first resistor may be operatively connected to a ground terminal.

The first resistor may be monolithically integrated with the first power transistor and the second transistor, for example, the first resistor may comprise a 2DEG layer. Alternatively, the first resistor may be external to the first power transistor and the second transistor.

As the current through the first resistor increases, the second gate voltage of the second transistor is elevated and the equivalent on-resistance of the second transistor may decrease providing a reduction in the resistance of the path between the first gate terminal and the source terminal of the main power transistor. This limits the potential on the first gate terminal. The circuit can then act as protection from a drain over-current event, occurring in the first power device. Alternatively, a resistive load may be used in place of a resistor. The resistive load may comprise a normally-on transistor.

The device may further comprise a sensing pad and a second terminal of the first resistor may be connected to the sensing pad such that the current through the current sensing transistor can be measured. This can be used to determine the current in the main power transistor, by using the scale factor of the active areas of the two transistors and the size of the first resistor.

The device may further comprise a second resistor. The second resistor may be in series with the first resistor. The second resistor may form a potential divider with the first resistor. The choice of resistances for the two resistors allows an easy adjustment of the maximum current level possible between the drain and source terminals of the main power transistor.

The second heterojunction transistor may be configured as an enhancement mode transistor. The potential at the gate terminal of the enhancement mode transistor may increase as the current through the current sensing (first) resistor is increased, raising the potential on the gate of the second enhancement mode transistor and thus adjusting its resistance. A critical current through the first power transistor can turn on the second enhancement mode transistor limiting the potential on the gate of the main power transistor. The circuit described can act as protection from a drain over-current event occurring in the first power device.

The second heterojunction transistor may be configured as a depletion mode transistor. When no current is present in the first power device, the gate of the second transistor is grounded, but because of the normally-on nature, the current still flows through the depletion mode transistor. In this mode the second heterojunction transistor acts as a resistive load between the gate and the source of the first main power device. The potential at the gate terminal of the second heterojunction transistor may increase as the current through the current sensing (first) resistor is increased, thus raising the potential on the gate of the second heterojunction transistor. A critical current through the first power transistor can lead to a potential higher than the second threshold voltage of the normally-on transistor. This results in a steep decrease of the on-resistance of the second heterojunction transistor which in turn leads to limiting of the potential on the gate of the main power transistor. The circuit described here can act as protection from a drain over-current event occurring in the first power device.

According to the third aspect of this invention the device may further comprise a potential divider. A terminal of the potential divider may be connected to the first gate terminal (of the main power transistor) and a mid-point of the potential divider may be connected to the second gate terminal of the second heterojunction transistor which, in this case, is configured as a normally-on (depletion mode) transistor. The potential divider may be integrated with the first power transistor and the second transistor for example, as a 2DEG layer. Alternatively, the potential divider may be formed of external resistors or resistive loads.

The second transistor may be used to lower or limit the gate voltage on the main power (first) transistor when a condition of over gate voltage is detected in the main power transistor. The gate voltage detection can be done by using a potential divider attached to the gate of the main power device with the mid-point connected to the gate of the second transistor.

The potential divider may comprise at least two resistors in series. The at least two resistors of the potential divider may each comprise a two-dimensional electron gas (2DEG).

The heterojunction power device may comprise a voltage limiting circuit composed of two resistors forming a potential divider and an actively switched low voltage depletion mode (second) transistor. The drain source path of the actively switched low voltage depletion mode transistor may be connected between the gate and source of the main power transistor and in parallel with the potential divider. The mid-point of the potential divider may be connected to the gate terminal of the second (low voltage) depletion mode transistor. In this embodiment, the resistance of the depletion mode transistor can be reduced, and thus adjusts the resistance between the main power device gate terminal and the main power device source terminal, when the potential of the main power device gate terminal is increased. The potential divider formed by the resistors may determine the potential on the gate terminal of the depletion mode transistor. The circuit described can protect the main power gate terminal (of the first power device) from over gate voltage events.

According to a fourth aspect of the invention the sensing and protection functions may refer to both sensing of the current through the first terminal of the first power heterojunction transistor and sensing the first gate terminal voltage of the power heterojunction transistor and as a result of either of the sensing functions, limiting the voltage applied to the first gate of the power heterojunction transistor.

In this aspect of the invention, the second transistor, configured as a normally-on device, may further comprise a third gate terminal (so that the second transistor has two gates itself). The second gate terminal may be connected to a midpoint of the potential divider; and the device may further comprise a first resistor and wherein the third gate terminal is connected to a first terminal of the resistor. In other words, the second transistor may be a double gate transistor.

The second heterojunction transistor may comprise at least two pluralities of highly doped semiconductor regions of a first conductivity type, and the second gate terminal may be formed over one plurality of highly doped semiconductor regions, wherein third gate terminal may be formed over another plurality of highly doped semiconductor regions. Each of the pluralities of highly doped semiconductor regions may comprises at least two highly doped semiconductor regions laterally spaced from each other in a second dimension. In other words, the double gate transistor may have two gates with discontinuous p-GaN gate islands, as described above.

A normally-on (depletion mode) transistor with a double gate may be used as the second transistor, with the first gate connected to the mid-point of the potential divider described above and the second gate connected to the resistor/resistive load attached to the current sensor device. In this case if one condition or the other (over-current detection in the first main power device or over gate voltage detection in the first main power device) occurs, a steep decrease in the on-state resistance of the second heterojunction transistor is triggered, pulling the gate potential lower until one of the conditions (over-current detection or over gate voltage-detection) is no longer detected. This results in limiting the gate voltage to a desired level for increased safe operating area and robustness.

According to a further aspect of the present disclosure there is provided a method of manufacturing a III-nitride semiconductor based heterojunction power device, the method comprising:
  forming a first III-nitride semiconductor region formed on a substrate, wherein the first III-nitride semiconductor region comprises a first heterojunction comprising at least one two dimensional carrier gas of the second conductivity type;
  forming a first terminal operatively connected to the first III-nitride semiconductor region;
  forming a second terminal laterally spaced from the first terminal and operatively connected to the first III-nitride semiconductor region;
  forming a first gate terminal formed over the first III-nitride semiconductor region between the first terminal and the second terminal;
  forming a second III-nitride semiconductor region formed over the substrate, wherein the second III-nitride semiconductor region comprises a second heterojunction comprising at least one two dimensional carrier gas of the second conductivity type;
  forming a third terminal operatively connected to the second III-nitride semiconductor region;
  forming a fourth terminal laterally spaced from the third terminal in a first dimension and operatively connected to the second III-nitride semiconductor region, wherein the fourth terminal is connected to the first gate terminal; and
  forming a second gate terminal formed over the second III-nitride semiconductor region between the third terminal and the fourth terminal.

The first plurality of highly doped semiconductor regions (in the first transistor) and the second plurality of highly doped regions (in the second transistor) may be manufactured in the same process step. The difference between continuous highly doped semiconductor regions and discontinuous highly doped semiconductor regions may be realized by a layout change of the same mask.

Finally, in summary of the discussions above, the invention is described as follows:

The invention relates to a semiconductor device in GaN technology with an integrated sensing and protection circuit where the main power transistor which uses a gate structure based on a continuous p-GaN layer and transistors used for sensing are made using the same gate technology featuring continuous or discontinuous p-GaN layers. The drain terminal of at least one of the sensing transistors (the second heterojunction transistor) is connected to the gate terminal of the main power transistor. Different implementations of protection circuits are described to mitigate gate over-voltage and drain over-current events. This helps with a rugged operation and increased safe operating area. In the main embodiment, a normally-on, depletion mode transistor which contains a gate structure based on discontinuous p-GaN layer containing islands within stripes or closed shapes around the cells senses a specific own gate voltage or/and drain current of the main power transistor and acts to lower or limit the gate voltage on the main power transistor when a condition of over gate voltage or over drain current is detected in the main power transistor. The specific on-state gate voltage (mentioned above) is equal to the voltage at which a two dimensional electron gas (2DEG) is formed under the p-GaN islands and results in a steep decrease in the on-state resistance of the normally on, depletion mode transistor.

In a second aspect of the invention, a current sensing device made of an identical structure to the main power device, but scaled to a known, much smaller area when compared to the main power device (by a factor X where X is much larger than 1) is monolithically integrated with the main power device. The current sensor device has the drain and the gate terminals connected to the drain and gate terminals of the main transistor respectively. The source of the current sensor device is connected to one terminal of a resistor, or a resistive load (that could be made of a normally on transistor) which could be preferably monolithically integrated (by for example using a 2DEG layer) or could be external. The second terminal of the resistor could be connected to the source of the main power device or to the ground. Alternatively, the first terminal of the resistor could be connected to an independent pad in order to measure externally the current through the current sensor and thus determine the current in the main power device. The role of the resistor/resistive load is to translate the current from the current sensor into a voltage drop across it. The first terminal of the resistor could be connected to the gate terminal of the second heterojunction transistor which could be either a normally-on (depletion mode) or a normally-off (enhancement mode) device using the discontinuous or continuous p-GaN technology respectively. This acts to lower or limit the gate voltage on the main power transistor when a condition of over drain current is detected in the main power transistor, by using the current sensor device and the resistor or resistive element described above.

In a third aspect of this invention, the normally-on (described above in the main embodiment) or normally-off transistor is used to lower or limit the gate voltage on the main power transistor when a condition of over gate voltage is detected in the main power transistor. The gate voltage detection can be done by using a potential divider attached to the gate of the main power device with the mid-point connected to the gate of the second (normally-on) transistor. The potential divider can be made of integrated (for example by using 2DEG layers) or external resistors or resistive loads (normally-on transistors).

In a fourth aspect of this invention, a normally-on transistor with a double gate is used, with the first gate connected to the mid-point of the potential divider described above in the third aspect of this invention and the second gate connected to the resistor/resistive load attached to the current sensing device as described in the second aspect of this invention. In this case if one condition or the other (over-current detection or over gate voltage-detection) occurs, the normally-on transistor has a steep decrease in the on-resistance, pulling or limiting the gate potential of the main power transistor (first transistor) to a lower level until one of the conditions (over-current detection or over gate voltage-detection) is no longer detected. This results in limiting the gate voltage of the main power transistor (first transistor) to a desired level for increased safe operating area and robustness.

BRIEF DESCRIPTION OF THE DRAWINGS

The present disclosure will be understood more fully from the accompanying drawings, which however, should not be taken to limit the invention to the specific embodiments shown, but are for explanation and understanding only.

DETAILED DESCRIPTION OF PREFERRED EMBODIMENTS

The present disclosure will be understood more fully from the accompanying drawings, which however, should not be taken to limit the disclosure to the specific embodiments shown, but are for explanation and understanding only.

Figure 3:
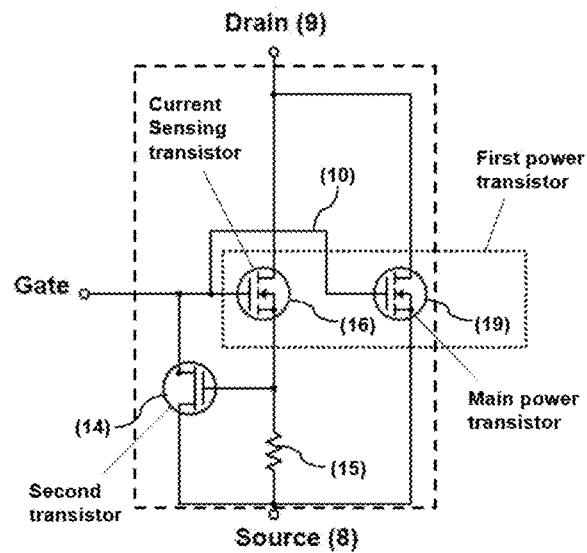
FIG. 3 shows a schematic circuit diagram of an over-current protection circuit according to one embodiment of the disclosure, wherein the over-current protection is composed of a resistor and an actively switched low voltage depletion mode transistor (second transistor) controlling the potential on the gate terminal of the first power transistor.

FIG. 3 shows a schematic circuit diagram of an over-current protection circuit according to one embodiment of the present disclosure, where the proposed invention is composed of a resistor and an actively switched low voltage depletion mode transistor (second transistor) controlling the potential on the gate terminal of the main power transistor. The over-current protection circuit includes a first power transistor 19 composed of a current sensing transistor 16 and a main power transistor 19, a depletion mode transistor (second transistor) 14, and a current sensing resistor 15.

In this embodiment the current sensing transistor 16 has an identical structure to the main power device 19, but is scaled to a known, much smaller area when compared to the main power device 19 (by a factor X where X is much larger than 1). The depletion mode transistor (second transistor) 14 is monolithically integrated with the first power transistor. The current sensing transistor 16 has the drain and the gate terminals connected to the gate and drain terminals of the main power transistor 19 respectively. The source of the current sensing transistor 16 is connected to one terminal of a resistor 15, or a resistive load (that could be formed of a normally-on transistor). The resistor 15 or resistive load could be monolithically integrated with the first power device 16, 19 and the second transistor 14 (by for example using a 2DEG layer). Alternatively, the resistor 15 or resistive load could be external. The second terminal of the resistor 15 could be connected to the source of the main power device 19 (as shown in FIG. 3a) or could be connected to the ground. Alternatively, the second terminal of the resistor 15 could be connected to an independent pad in order to measure externally the current through the current sensing device 16 and thus determine the current in the main power device 19. The role of the resistor/resistive load 15 is to translate the current from the current sensing transistor 16 into a voltage drop across it. The first terminal of the resistor 15 could be connected to the gate terminal of the second heterojunction transistor which could be a normally-on (depletion mode) device 14 (as shown in FIG. 3a and described above) or alternatively to a normally-off device using discontinuous or continuous p-GaN gate technology respectively. The circuit acts to lower or limit the gate voltage on the first power transistor 16, 19 when a condition of over drain current is detected in the current sensing transistor 16, by using the depletion mode device 14 and the resistor 15 or resistive element described above. If a condition of over-current is detected the voltage drop across current sensing resistor 15 increases and thus the voltage bias on the gate terminal of transistor 14 increases causing a sharp decrease in resistance of transistor 14. This provides a reduction in the resistance of the path between the gate and source of the first power device 16, 19 thus limiting the potential on the first gate terminal. The circuit described can act as protection from a drain over-current event.

Figure 4:
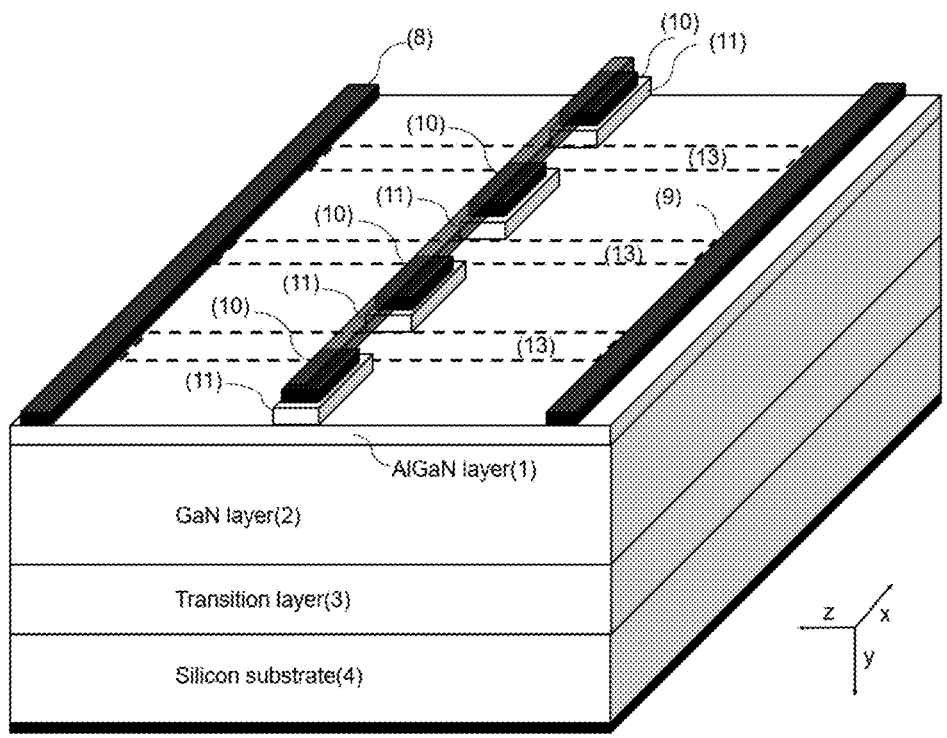
FIG. 4 shows a schematic perspective view of a depletion mode transistor that can be used in an embodiment device according to the present disclosure.

FIG. 4 shows a schematic perspective view of a depletion mode device used in the proposed protection circuits.

The depletion mode transistor also includes a high voltage drain terminal 9 arranged in physical contact with the AlGaN layer 1. The high voltage drain 9 terminal forms an Ohmic contact to the 2DEG. A low voltage source terminal 8 is also arranged in physical contact with the AlGaN layer 1 and also forms an Ohmic contact to the 2DEG. The drain 9 and source 8 terminals consist of Ohmic metal contacts on the surface of AlGaN layer 1 or directly in contact with a good electrical connection to the 2DEG.

Regions of highly p-doped III-V semiconductor 11 are formed in contact with the AlGaN semiconductor layer 1. These have the function of reducing the 2DEG carrier concentration under the highly doped regions 11 when the device is unbiased, and are formed of p-GaN material in this embodiment. The p-GaN regions 11 are discrete regions and are spaced from each other in the 2nd dimension (the x-direction). The p-GaN regions 11, also known as p-GaN islands, extend in the x-direction in a discontinuous line. The discontinuous layer of a p-type GaN gate is made of islands placed within stripes or closed shapes. The highly p-doped GaN regions 11 may be Magnesium (Mg) doped. The highly p-doped GaN regions 11 extend along an axis which is perpendicular to the axis connecting the source terminal 8 and the drain terminals 9, where the current flows.

The highly doped layer 11 in the discontinuous gate structure of the depletion mode device may be manufactured in the same process step as a highly doped layer of the main power transistor. All p-GaN layers (continuous or discontinuous) can be done in the same process step. The difference between continuous and discontinuous layers is realized by a layout change of the same mask.

A gate control terminal 10 is configured over the highly doped regions 11 in order to control the carrier density of the 2DEG at the interface of the semiconductor layers 1, 2. All the p-GaN islands 11 of the depletion mode device are connected to the same gate electrode 10. The gate terminal 10 consists of metal contacts placed on the intermittent regions of the p-GaN islands 11. The electrical connection between the high voltage terminal (drain) 9 and the low voltage terminal (source) 8 is determined by a voltage signal applied on the third terminal (gate) 10. The gate control terminal 10 can be either an Ohmic contact or a Schottky contact.

Figure 1:
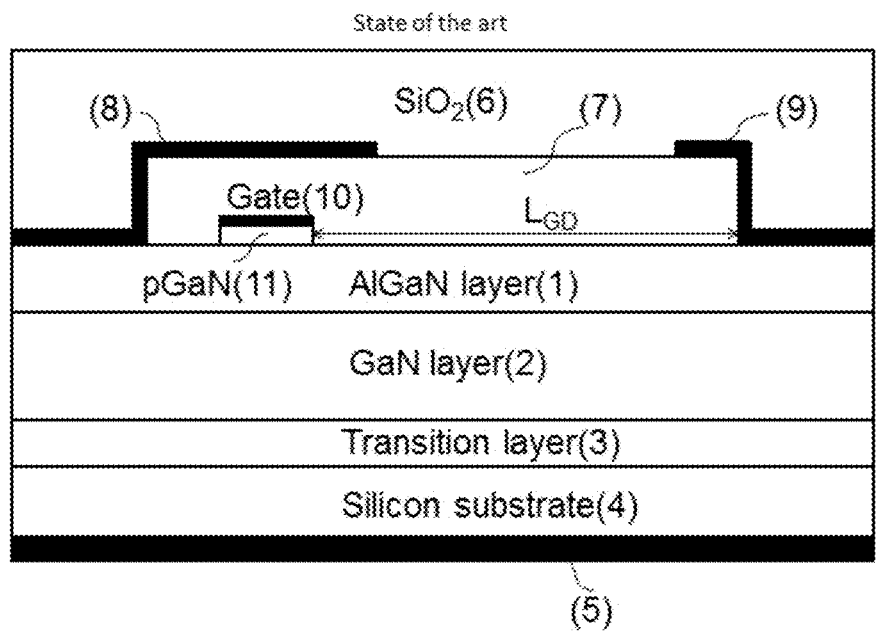
FIG. 1 shows a schematic cross section of the active area of a state-of-the-art p-GaN HEMT.
Figure 2:
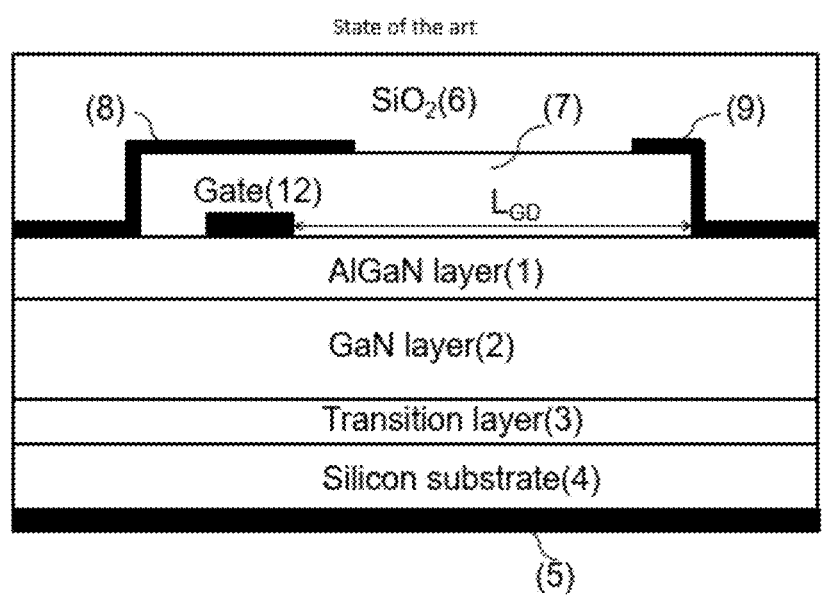
FIG. 2 shows a schematic cross section of the active area of a state-of-the-art depletion mode HEMT with a Schottky gate terminal.

The depletion mode device as described in the embodiments may be the depletion mode AlGaN/GaN HEMT shown in FIG. 4. There are advantages of the proposed structure compared to using the state-of-the-art Schottky gate depletion mode AlGaN/GaN HEMT, such as that shown in FIG. 2.

The proposed depletion mode device enables the control of the device threshold voltage through adjustments in the layout design of the transistor rather than adjustments in epitaxial growth or the gate metal stack. Layout re-design leads to an optimized device at a much lower cost/effort than the other methods currently available.

The depletion mode device used as a component may be a normally-on depletion mode device where an increased positive gate bias voltage can be applied (>7V) before the main on-state conduction channel changes from drain-source to gate-source. Currently in state-of-the-art devices the voltage at which gate turn-on occurs is typically between 0.7-2V. At higher positive gate terminal bias, the proposed depletion mode device can achieve an increased carrier density in the channel beneath the gate terminals reducing the overall on-state resistance of the device.

This gate structure of the depletion mode device allows the fabrication of a depletion mode device in a fabrication process which could not be used to form a depletion mode device with a Schottky contact directly on the top AlGaN layer. In state-of-the-art device, the gate of the depletion mode device would have to be manufactured using additional process steps.

The use of such the depletion mode device can therefore enable increased integration of protection electronics with the main power switch. The monolithic integration of the electronics described above allows a reduction in the overall system size and costs as well as lower BOM (bill of material) and increased reliability. It can also lead to improved performance through the reduction of parasitic components associated with the interconnections between discrete devices.

Figure 5:
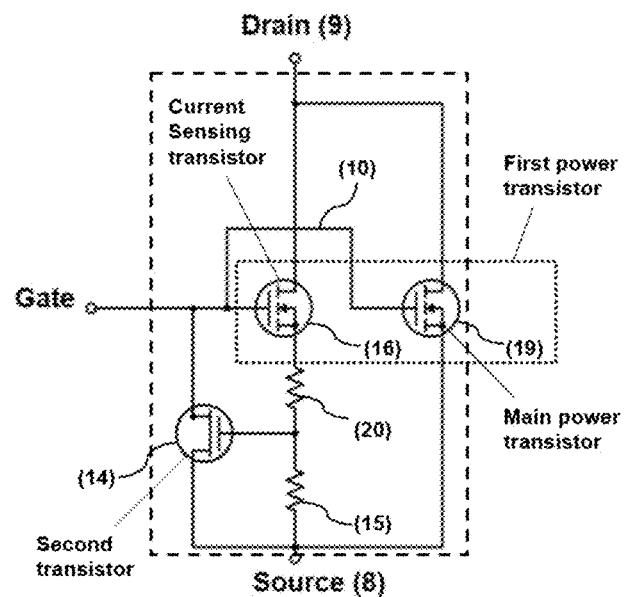
FIG. 5 shows a schematic circuit diagram of a further embodiment of the proposed disclosure, in which the device further includes a resistor or resistive load.

FIG. 5 shows a schematic circuit diagram of a further embodiment of the proposed disclosure. This is similar to the embodiment shown in FIG. 3 and provides similar functionality; however in this embodiment the circuit includes a further resistor 20.

The second resistor 20 is added in series with the current sensing transistor 16. The second resistor forms a potential divider with the first resistor 15. The choice of resistances for the two resistors 15, 20 allows an easy adjustment of the maximum current level possible between the drain and source terminals of the main power transistor 19 in this arrangement.

Figure 6:
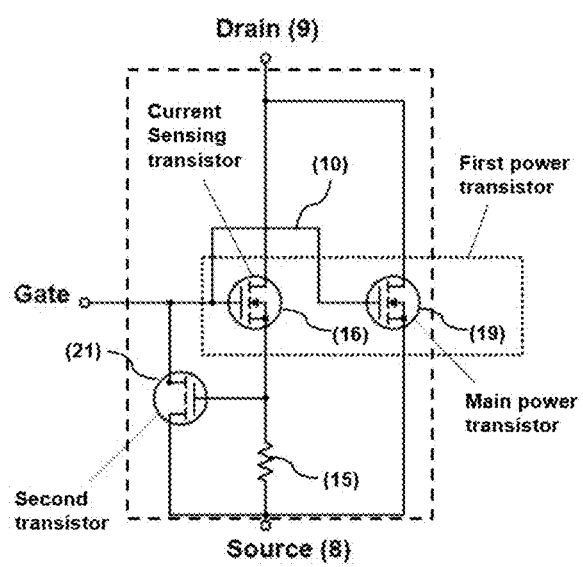
FIG. 6 shows a schematic circuit diagram of further embodiment of the proposed disclosure in which an over-current protection circuit is implemented which is composed of a resistor and an actively switched low voltage enhancement mode transistor (second transistor) controlling the potential on the gate terminal of the first power transistor.

FIG. 6 shows a schematic circuit diagram of a further embodiment of the proposed disclosure where an over-current protection circuit is implemented which is composed of a resistor 15 and an actively switched low voltage enhancement mode transistor (second transistor) 21 controlling the potential on the gate terminal of the first power transistor 16, 19. This is similar to the embodiment shown in FIG. 3 and provides similar functionality; however the enhancement mode transistor 21 replaces the depletion mode transistor of previous embodiments.

The heterojunction power device may include an over-current protection circuit as described above where the low voltage depletion mode transistor is replaced with a low voltage enhancement mode transistor 21. Similarly to previous embodiments, the potential at the gate terminal of the enhancement mode transistor 21 is increased as the current through the current sensing resistor 15 is increased. As current through the high resistance transistor 16 increases, the potential drop across the current sensing resistor 15 increases. This raises the potential on the gate of the low voltage enhancement mode transistor 21 and thus adjusts its resistance. A critical current through the high resistance transistor 16 can turn on the low voltage enhancement mode transistor 21 limiting the potential on the gate of the first power transistor 16, 19. The circuit described can act as protection from a drain over-current event.

Figure 7:
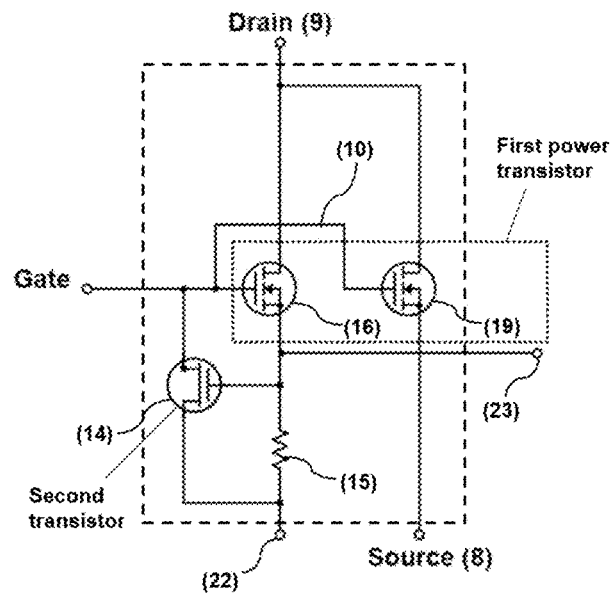
FIG. 7 shows a schematic circuit diagram of a further embodiment of the proposed disclosure in which an over-current protection circuit is implemented, and in which additional external terminals are provided.

FIG. 7 shows a schematic circuit diagram of a further embodiment of the proposed disclosure where an over-current protection circuit is implemented, in which additional external terminals are provided. This is similar to the embodiment shown in FIG. 3 and provides similar functionality; however in this embodiment external terminal 22 and external terminal 23 are included.

In this embodiment the second terminal of the resistor 15 is used as an external terminal 22 instead of being connected to the source of the main power transistor 19. Additionally, a further external terminal 23 is added to measure the current through the current sensing transistor 16.

Figure 8:
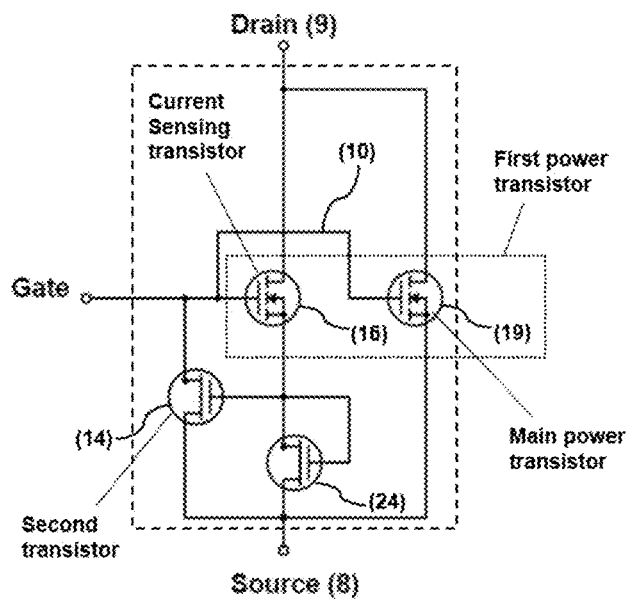
FIG. 8 shows a schematic circuit diagram of a further embodiment of the proposed disclosure in which an over-current protection circuit is implemented, and in which the current sensing resistor is replaced by an appropriately scaled normally-on transistor.

FIG. 8 shows a schematic circuit diagram of a further embodiment of the proposed disclosure in which an over-current protection circuit is implemented, and in which the current sensing resistor is replaced by an appropriately scaled normally-on transistor 24 with the drain terminal of the normally-on transistor 24 connected to the gate terminal of normally-on transistor 24. This is similar to the embodiment shown in FIG. 3 and provides a similar functionality. The normally-on transistor 24 in this configuration will act as a resistive element. The source terminal of transistor 24 may be connected to the source terminal of the main power transistor 19 or may be an external terminal.

Figure 9:
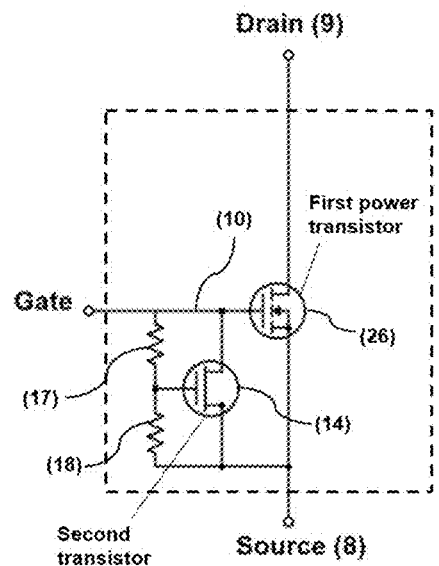
FIG. 9 shows a schematic circuit diagram of a voltage limiting circuit according to one embodiment of the disclosure, where the voltage limiting circuit is composed of two resistors forming a potential divider and an actively switched low voltage depletion mode transistor (second transistor) controlling the potential on the gate terminal of the first power transistor.

FIG. 9 shows a schematic circuit diagram of a voltage limiting circuit according to one embodiment of the proposed disclosure, where a voltage limiting circuit is composed of two resistors in series 17, 18 forming a potential divider and an actively switched low voltage depletion mode transistor (second transistor) 14 controlling the potential on the gate terminal of the first power transistor. In this figure the first power transistor is shown as a single transistor 26.

In this embodiment of the disclosure, the normally-on transistor 14 is used to lower or limit the gate voltage on the first power transistor 26 when a condition of over gate voltage is detected in the first power transistor 26. The depletion mode transistor 14 may be a normally-on transistor or could alternatively be a normally-off transistor. The gate voltage detection is done by using the potential divider 17, 18 attached to the gate of the first power device 26 with the mid-point connected to the gate of the depletion mode transistor 14. The potential divider 17, 18 can be integrated with the main power transistor 26 and the depletion mode transistor 14 (for example by using 2DEG layers). Alternatively, the potential divider may include resistors or resistive loads (for example normally-on transistors) that are external to the transistor 14, 26.

Figure 10:
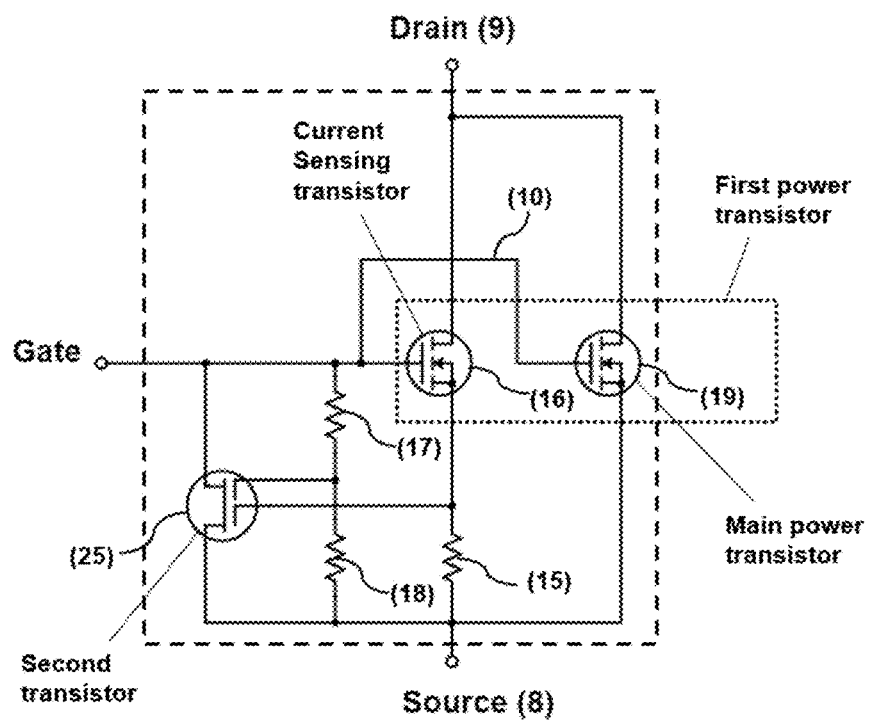
FIG. 10 shows a schematic circuit diagram in which the over-current protection circuit shown in FIG. 3 and the over-voltage protection circuit shown in FIG. 9, are combined into a single integrated (or discreet) circuit with the same functionality.

FIG. 10 shows a schematic circuit diagram of a proposed embodiment of the disclosure where the over-current protection circuit shown in FIG. 3 and the over-voltage protection circuit shown in FIG. 9 are be combined into a single integrated (or discreet) circuit with the same functionality. In this embodiment the depletion mode transistor of the previous embodiments, is a double gate terminal normally-on transistor (second transistor) 25.

In this embodiment, a normally-on transistor 25 with a double gate is used, with the first gate connected to the mid-point of the potential divider 17, 18 described above and the second gate connected to the resistor/resistive load 15 attached to the current sensing transistor 16. In this case if one condition or the other occurs (over-current detection or over gate voltage-detection), then the normally-on transistor 25 has a steep increase in the current pulling the gate potential lower until one of the conditions (over-current detection or over gate voltage-detection) is no longer detected. This results in limiting the gate voltage of the first power transistor 16, 19 to a desired level for increased safe operating area and robustness.

Figure 11:
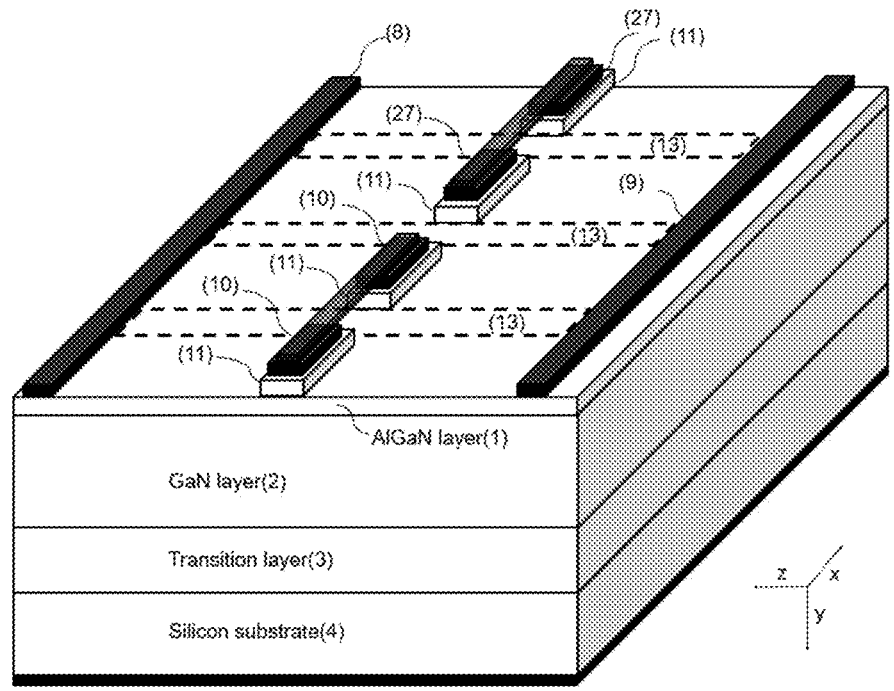
FIG. 11 shows a schematic perspective view of a double gate terminal normally-on transistor that can be used in the circuit shown in FIG. 10.

FIG. 11 shows a schematic perspective view of the double gate terminal normally-on transistor used in the circuit schematic shown in FIG. 10. In this embodiment there are two pluralities of highly doped regions 11. The first gate contact 10 is connected to the first plurality of highly doped regions and the second gate contact 27 is connected to the second plurality of highly doped regions.

Figure 12:
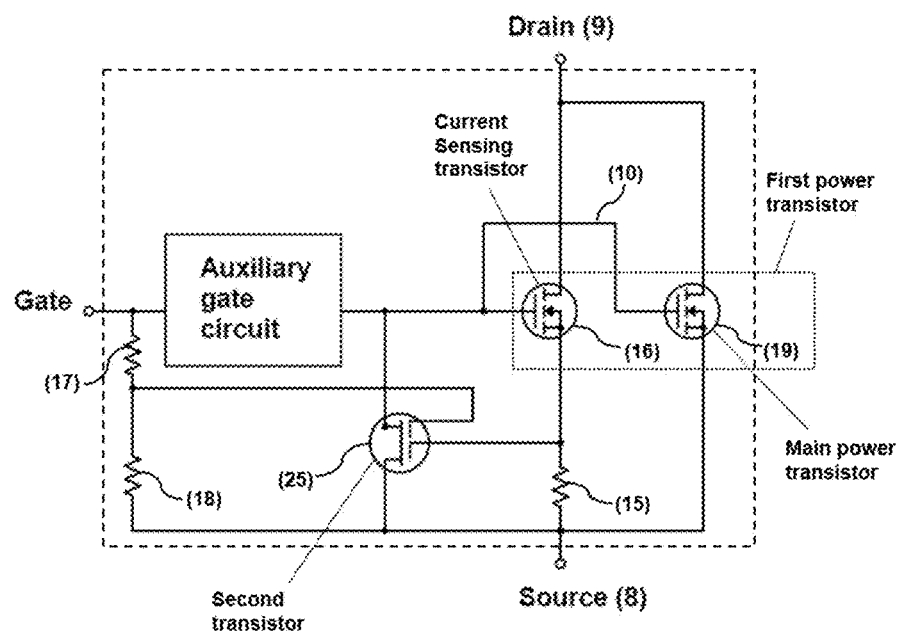
FIG. 12 shows an alternative schematic circuit diagram of the combined protection circuit according to an embodiment of the disclosure.

FIG. 12 shows an alternative schematic circuit diagram of the combined protection circuit according to an embodiment of the disclosure. In this embodiment, the combined protection circuit can be used in an integrated (or discrete) circuit with an auxiliary gate circuit such as the one described in the PCT application 'WO2019012293A1: A power semiconductor device with an auxiliary gate structure', and which is incorporated herein by reference in its entirety.

Figure 13:
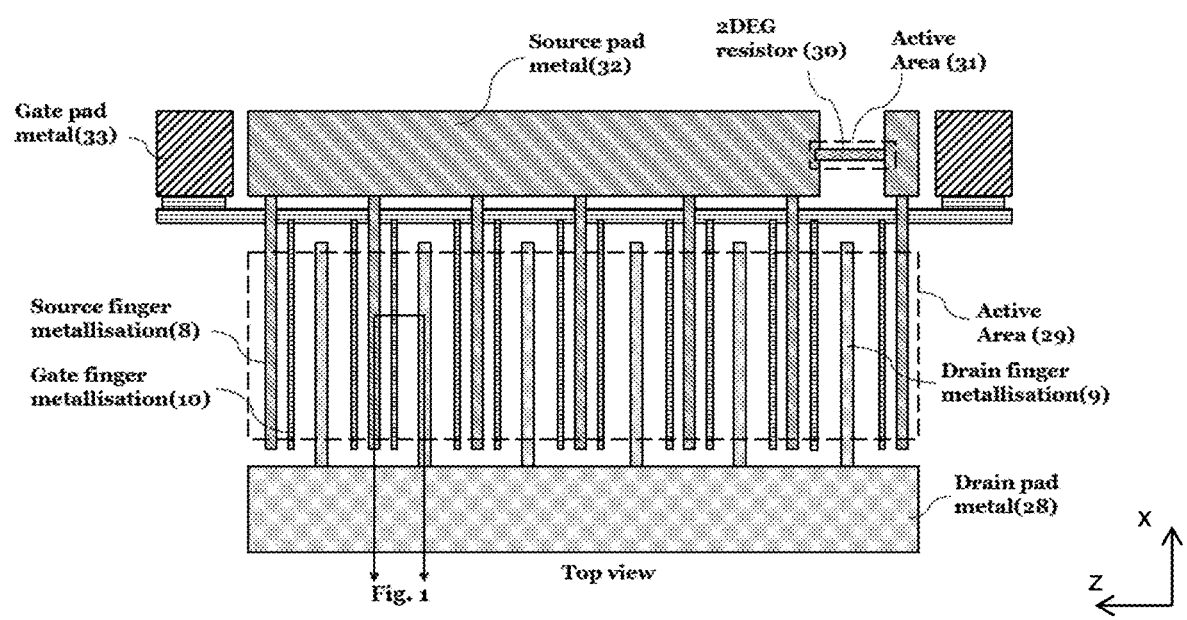
FIG. 13 shows a schematic top view of the layout design for the monolithic integration of the current sensing transistor, the main power transistor, and the sensing resistor.

FIG. 13 shows a schematic top view of a layout design for the monolithic integration of the current sensing transistor 16, the main power transistor 19, and the sensing resistor 15. In this embodiment the current sensing transistor 16 and main power transistor 19 share the same active area 29, the same drain pad 28 and the same gate pad 33 but not the same source metallisation/pad. The sensing resistor 15 (2DEG resistor 30) is formed in active area 31, isolated from the active area of current sensing transistor 16 and main power transistor 19 and is connected in series with the two source terminals of transistors 16, 19.

LIST OF REFERENCE NUMERALS

1 AlGaN layer
2 GaN layer
3 Transition layer
4 Silicon substrate
5 Substrate terminal
6 SiO$_2$ passivation
7 Surface passivation dielectric
8 Source terminal
9 Drain terminal
10 Gate terminal
11 Highly doped pGaN cap
12 Schottky gate terminal
13 Uninterrupted conduction channel at zero gate-source bias
14 Depletion mode transistor
15 Current sensing resistor
16 High resistance transistor
17, 18 Potential divider resistors
19 Low resistance transistor
20 Resistor
21 Low voltage enhancement mode transistor
22, 23 External terminals
24 Additional normally-on transistor
25 Double gate depletion mode transistor
26 Main power transistor
27 Additional gate of double gate transistor
28 Drain pad metal
29 Transistor active area
30 2DEG resistor
31 2DEG resistor active area
32 Source pad metal
33 Gate pad metal The skilled person will understand that in the preceding description and appended claims, positional terms such as 'top', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

The invention claimed is:

1. A III-nitride semiconductor based heterojunction power device, comprising:
a first heterojunction transistor formed on a substrate, the first heterojunction transistor comprising:
a first III-nitride semiconductor region formed over the substrate, wherein the first III-nitride semiconductor region comprises a first heterojunction comprising at least one two dimensional carrier gas of second conductivity type;
a first terminal operatively connected to the first III-nitride semiconductor region;
a second terminal laterally spaced from the first terminal and operatively connected to the first III-nitride semiconductor region;
a first gate region formed over the first III-nitride semiconductor region between the first terminal and the second terminal;
a first gate terminal contacting the first gate region,
a second heterojunction transistor formed on the substrate, the second heterojunction transistor comprising:
a second III-nitride semiconductor region formed over the substrate, wherein the second III-nitride semiconductor region comprises a second heterojunction comprising at least one two dimensional carrier gas of second conductivity type;
a third terminal operatively connected to the second III-nitride semiconductor region;
a fourth terminal laterally spaced from the third terminal in a first dimension and operatively connected to the second III-nitride semiconductor region, wherein the fourth terminal is operatively connected to the first gate terminal;
a second gate region, formed over the second III-nitride semiconductor region between the third terminal and the fourth terminal; and
a second gate terminal contacting the second gate region, and
wherein the second heterojunction transistor is configured such that the second heterojunction transistor is used in sensing and protection functions of the first heterojunction transistor; and
further comprising a current sensing transistor monolithically integrated with the first heterojunction transistor which has a substantially identical structure to the first heterojunction transistor, and wherein the current sensing transistor is scaled to a smaller area than the first heterojunction transistor by a scale factor X, where X is larger than 1.

2. The heterojunction based power device according to claim 1, wherein the first heterojunction transistor further comprises a first one or plurality of highly doped semiconductor regions of a first conductivity type formed over the first III-nitride semiconductor region, and wherein the first gate terminal is formed over the first one or plurality of highly doped semiconductor regions; and wherein the second heterojunction transistor comprises a second one or plurality of highly doped semiconductor regions of the first conductivity type formed over the second III-nitride semiconductor region, and wherein the second gate terminal is formed over the second one or plurality of highly doped semiconductor regions.

3. The heterojunction based power device according to claim 2, wherein the second plurality of highly doped semiconductor regions comprises at least two highly doped semiconductor regions of the first conductivity type laterally spaced from each other in a second dimension.

4. The heterojunction based power device according to claim 1, wherein the second heterojunction transistor is configured as a depletion mode or normally-on field effect transistor.

5. The heterojunction based power device according to claim 1 wherein the sensing and protection functions are performed by sensing of a current through the first terminal of the first heterojunction transistor and by limiting of a gate voltage of the first heterojunction transistor.

6. The heterojunction based power device according to claim 1 wherein the sensing and protection functions are performed by sensing a first gate terminal voltage of the first heterojunction transistor and by limiting a voltage applied to a first gate of the first heterojunction transistor.

7. The heterojunction based power device according to claim 6, wherein the device further comprises a third transistor, wherein a drain terminal and a gate terminal of the third transistor are operatively connected, and wherein a source terminal of the third transistor is operatively connected to the first terminal of the first heterojunction transistor.

8. The heterojunction based power device according to claim 1 wherein the sensing and protection functions are performed by both sensing of a current through the first terminal of the first heterojunction transistor and by sensing a first gate terminal voltage of the first heterojunction transistor and as a result of either of the sensing functions, limiting a voltage applied to the first gate of the first heterojunction transistor.

9. The heterojunction based power device according to claim 1, wherein the first heterojunction transistor and the second heterojunction transistor are monolithically integrated on the same substrate.

10. The heterojunction based power device according to claim 1, wherein the device further comprises a first resistor and wherein a terminal of the current sensing transistor is operatively connected to a first terminal of the first resistor.

11. The heterojunction based power device according to claim 10, wherein a second terminal of the first resistor is operatively connected to the first terminal of the first heterojunction transistor.

12. The heterojunction based power device according to claim 11, further comprising a sensing pad and wherein a first terminal of the first resistor is connected to the sensing pad such that a current through the current sensing transistor can be measured.

13. The heterojunction based power device according to claim 11, further comprising a second resistor and wherein the second resistor is in series with the first resistor.

14. The heterojunction based power device according to claim 11, wherein the second heterojunction transistor is configured as an enhancement mode transistor.

15. The heterojunction based power device according to claim 1, wherein the second heterojunction transistor is a normally-on transistor and is configured to lower or limit a voltage of the first gate terminal in response to a detection of a voltage of the first gate terminal over a predetermined threshold.

16. The heterojunction based power device according to claim 15, wherein the device further comprises a potential divider, wherein a terminal of the potential divider is connected to the first gate terminal and wherein a mid-point of the potential divider is connected to the second gate terminal.

17. The heterojunction based power device according to claim 15, wherein the second transistor further comprises a third gate terminal, and wherein the second gate terminal is connected to a midpoint of the potential divider; and wherein the device further comprises a first resistor and wherein the third gate terminal is connected to a first terminal of the resistor.

18. The heterojunction based power device according to claim 17, wherein the second heterojunction transistor comprises at least two pluralities of highly doped semiconductor regions of a first conductivity type, and wherein the second gate terminal is formed over one plurality of highly doped semiconductor regions, wherein the third gate terminal is formed over another plurality of highly doped semiconductor regions, and wherein each of the plurality of highly doped semiconductor regions comprises at least two highly doped semiconductor regions laterally spaced from each other in a second dimension.

19. A method of manufacturing a III-nitride semiconductor based heterojunction power device, the method comprising:

forming a first III-nitride semiconductor region formed on a substrate, wherein the first III-nitride semiconductor region comprises a first heterojunction transistor comprising at least one two dimensional carrier gas of second conductivity type;

forming a first terminal operatively connected to the first III-nitride semiconductor region;

forming a second terminal laterally spaced from the first terminal and operatively connected to the first III-nitride semiconductor region;

forming a first gate terminal formed over the first III-nitride semiconductor region between the first terminal and the second terminal;

forming a second III-nitride semiconductor region formed over the substrate, wherein the second III-nitride semiconductor region comprises a second heterojunction transistor comprising at least one two dimensional carrier gas of the second conductivity type;

forming a third terminal operatively connected to the second III-nitride semiconductor region;

forming a fourth terminal laterally spaced from the third terminal in a first dimension and operatively connected to the second III-nitride semiconductor region, wherein the fourth terminal is connected to the first gate terminal;

forming a second gate terminal formed over the second III-nitride semiconductor region between the third terminal and the fourth terminal; and forming the second gate terminal contacting the second gate region, and wherein the second heterojunction transistor is used in sensing and protection functions of the first heterojunction transistor; and forming a current sensing transistor monolithically integrated with the first heterojunction transistor which has a substantially identical structure to the first heterojunction transistor, and wherein the current sensing transistor is scaled to a smaller area than the first heterojunction transistor by a scale factor X, where X is larger than 1.

* * * * *